(12) United States Patent
Li et al.

(10) Patent No.: US 6,540,525 B1
(45) Date of Patent: Apr. 1, 2003

(54) HIGH I/O STACKED MODULES FOR INTEGRATED CIRCUITS

(75) Inventors: Che-Yu Li, Ithaca, NY (US); David A. Lysack, Liverpool, NY (US); Brian D. Harry, Baldwinsville, NY (US); John J. Kresse, Liverpool, NY (US)

(73) Assignee: High Connection Density, Inc., Sunnyvale, CA (US)

( * ) Notice: Subject to any disclaimer, the term of this patent is extended or adjusted under 35 U.S.C. 154(b) by 0 days.

(21) Appl. No.: 09/932,525

(22) Filed: Aug. 17, 2001

(51) Int. Cl.[7] .............................................. H01R 12/00
(52) U.S. Cl. ......................................... 439/66; 439/331
(58) Field of Search ............................ 439/66, 70, 71, 439/591, 331, 91

(56) References Cited

U.S. PATENT DOCUMENTS

| | | | | |
|---|---|---|---|---|
| 3,904,934 A | * | 9/1975 | Martin ........................ 361/776 |
| 5,109,320 A | * | 4/1992 | Bourdelaise et al. ......... 361/705 |
| 5,153,814 A | * | 10/1992 | Wessely .................... 165/80.4 |
| 5,199,889 A | * | 4/1993 | McDevitt .................... 29/843 |
| 5,334,029 A | * | 8/1994 | Akkapeddi et al. ........... 439/66 |
| 5,810,607 A | * | 9/1998 | Shih et al. ................... 439/66 |
| 6,351,391 B1 | * | 2/2002 | Beliveau et al. ............ 174/255 |
| 6,354,844 B1 | * | 3/2002 | Coico et al. ................ 439/260 |

* cited by examiner

Primary Examiner—Tulsidas Patel
(74) Attorney, Agent, or Firm—Salzman & Levy

(57) ABSTRACT

The present invention is a cost effective module that provides high performance, high density and highly reliability interconnections needed between the various circuit devices that form a functional system or a part of a larger system. It includes circuit members having high speed, impedance-controlled transmission line signal paths, short land grid array interconnections between circuit members and, optionally, driver line terminators built into one of the circuit members, for maintaining high electrical performance. Suitable applications include mainframe computers, workstations, telecommunications networks, or other electronic equipment. The circuit members may be formed on conventional printed circuit cards with unpacked or packed circuit devices attached directly to the circuit members. Thermal control structures may be included to maintain the circuit devices within a reliable range of operating temperatures. A clamp is also included.

38 Claims, 10 Drawing Sheets

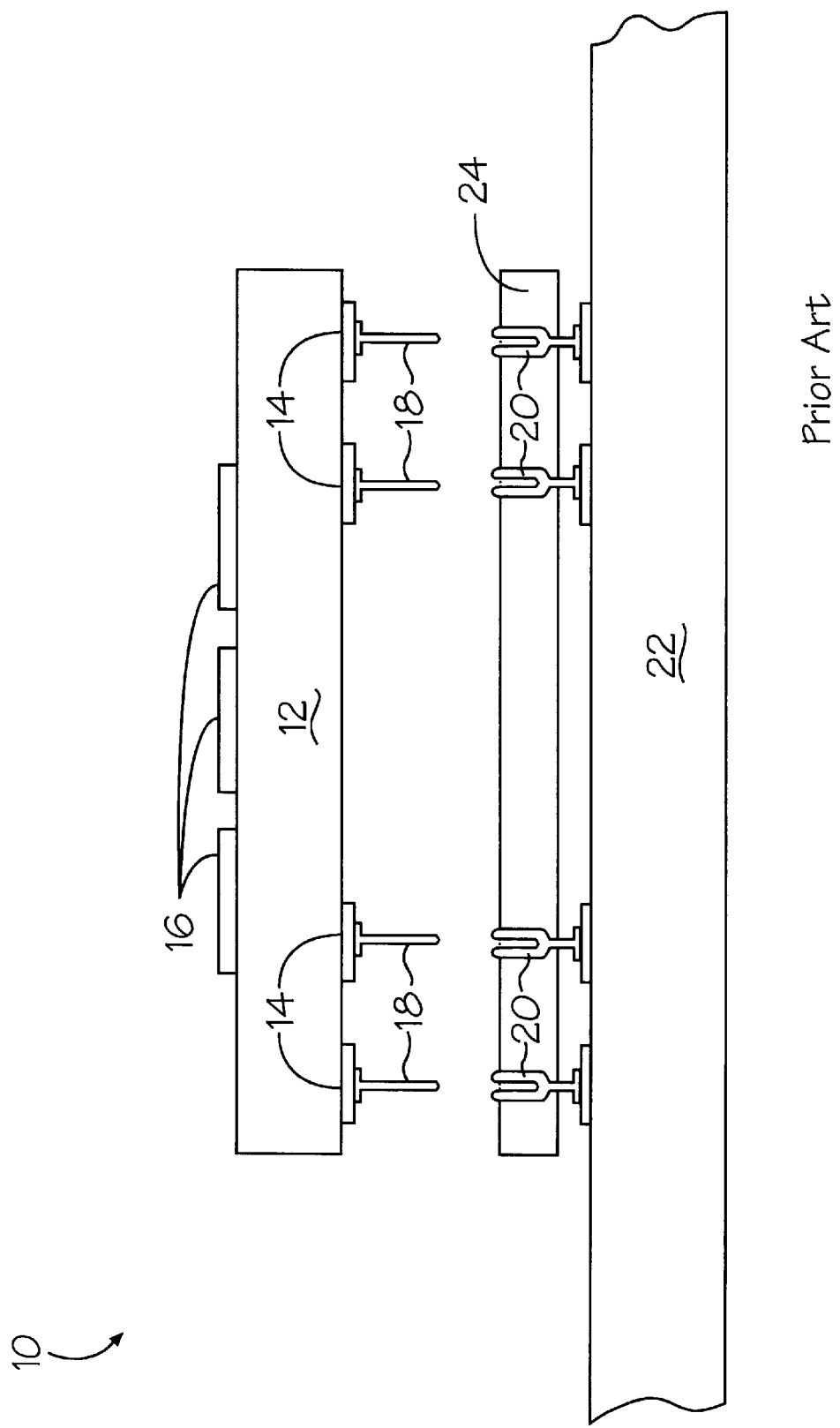

HIGH I/O STACKED MODULES FOR INTEGRATED CIRCUITS

RELATED PATENT APPLICATIONS

This application is related to U.S. Pat. No. 6,172,895, issued to Brown et al. for HIGH CAPACITY MEMORY MODULE WITH BUILT-IN HIGH SPEED BUS TERMINATIONS; and U.S. Pat. No. 6,264,476, issued to Li et al. for WIRE SEGMENT BASED INTERPOSER FOR HIGH FREQUENCY ELECTRICAL CONNECTION, which is based on application Ser. No. 09/457,776, filed Dec. 9, 1999; U.S. Pat. No. 6,312,266, issued to Fan et al. for CARRIER FOR LAND GRID ARRAY CONNECTORS, which is based on application Ser. No. 09/645,860, filed Aug. 24, 2000; copending U.S. patent applications Ser. Nos. 09/645,859 and 09/645,858, both filed Aug. 24, 2000; copending U.S. patent application Ser. Nos. 09/774,857 and 09/772,641, filed Jan. 31, 2001; copending U.S. patent application Ser. No. 09/791,342, filed Feb. 26, 2001, and copending U.S. patent application Ser. No. 09/866,434, filed May 29, 2001, all of which are hereby incorporated by reference.

FIELD OF THE INVENTION

The present invention relates to high input/output (I/O), high density, low cost electronic modules and, more particularly, to the high I/O, high density, low cost packaging of high performance, high density semiconductors having impedance-controlled transmission line buses and, optionally, driver line terminators built into the modules, for maintaining high electrical performance.

BACKGROUND OF THE INVENTION

A current trend in electronic package design for high speed, high performance electronic systems is to provide one or more multi-wiring layer, multi-chip ceramic or polymeric composite modules to provide the high performance, high density and highly reliability interconnections needed between the various circuit devices that form functional systems or parts of larger systems. The system may be a mainframe computer, a workstation, a telecommunications network, or any other electronic equipment.

Today's ceramic and polymeric composite modules are available in a wide variety of sizes and complexities ranging from small single-chip modules with a few layers of wiring to multi-chip modules greater than 100 mm square supporting over 100 chips and containing up to 90 layers of wiring. These modules predominantly use pin-and-socket or pin-grid-array (PGA) connectors for electrical interconnection to the motherboard. Both plated-through-hole (PTH) and surface mount technology (SMT) sockets are available. While both versions present an electrical discontinuity, the PTH version is electrically worse due to the extra pin length. However the SMT version, which typically has the sockets mechanically connected as part of a molded housing, has an important limitation: due to differences in the coefficient of thermal expansion (CTE) between the socket and the motherboard. This CTE difference limits the maximum number of solder joints for interconnection on the bottom of the module to between 400 and 500. For even higher quantities of interconnections, far more expensive solutions are required. An example of this is the Harcon® connector system on IBM's large thermally cooled modules (TCM's). In one recent example 4224 pins are included on a 127 mm square module. Even so, since the pins are unshielded, they present a significant electrical discontinuity to the system in today's high speed systems. One such system operates at a speed of 630 megahertz. Also, the maximum density achievable with an array of Harcon connectors is a 2.2 mm by 2.4 mm interstitial grid. Therefore the present ceramic and polymeric composite modules lack at least one of the following:

a) cost effective, high quantity I/O interconnections or connections to the motherboard b) superior interconnection or connection electrical performance.

High reliability for such a module, including the interconnections, is essential due to potential end product failure, should vital misconnections of these devices occur. It is also very important that both the module and especially the interconnections be as dense as possible, use the least possible amount of real estate on the module, provide high electrical integrity, and provide minimal impact on the wiring of the module as well as the mating motherboard or system board. In today's highly competitive marketplace, both the initial as well as the long-term cost of the module are also very important.

As system density and performance have increased so dramatically, so have the stringent specifications for interconnections. One way high electrical performance is manifested is in improved signal integrity. This can be accomplished by providing the interconnections with shielding that helps them to more closely match a desired system impedance. These demanding requirements, especially when coupled with the requirement for field-separability, have led to a wide variety of possible connector solutions.

Also, to assure effective repair, upgrade, and/or replacement of various components of the module (e.g., connectors, cards, chips, etc.), it is desirable that the connections within the module be reworkable at the factory. It is also highly desirable in some cases that, within the final product, such connections be separable and reconnectable in the field. Such a capability is also desirable during manufacturing in order to facilitate testing, for example.

A land grid array (LGA) is an example of such a connection in which each of two primarily parallel circuit elements to be connected has a plurality of contact points, arranged in a linear or two-dimensional array. An array of interconnection elements, known as an interposer, is placed between the two arrays to be connected, and provides the electrical connection between the contact points or pads. For even higher density interconnections and savings in the real estate of the motherboard, additional parallel circuit elements may be stacked and electrically connected through additional LGA connectors to create three-dimensional packages. In the prior art, a stacked structure relies on ball grid array (BGA) solder joints for the abovementioned connections. In any case, since a retentive force is not inherent as in a pin-and-socket type interconnection, a clamping mechanism is needed for LGA connections to create the force necessary to ensure each contact member is compressed an appropriate amount during engagement to form the required interconnections to the circuit elements. While LGA interposers and clamps are implemented in many different ways, the implementations of most interest are those described in the aforementioned copending U.S. patent applications.

For some applications between two primarily parallel circuit elements, the connections can be BGA solder joints instead of the LGA interposer described above. The BGA solder joints can be used in combination with the interposer. For example, within the stack of a stacked module, the connections can be BGA solder joints while the connections between the module and the motherboard can be provided by an LGA interposer. The use of BGA solder joints, however, will eliminate the convenience of field separability.

Alternatively, the LGA interposer can be replaced by a conventional PGA connector for module to motherboard connection while the LGA interposers are used within the module. The use of a PGA connector for connection from module to motherboard is important for those applications where the new module will be used to replace or upgrade an existing module (i.e., where the interconnection is already defined). An example of this is a microprocessor socket on a personal computer motherboard.

One of the most important factors for data moving into and throughout the module is that the effective impedance of the signal propagation paths is well controlled, and one end of the bus is terminated, preferably on the module, to the characteristic impedance of the system in order to maintain signal fidelity and signal integrity. Any impedance mismatches along the signal transmission path result in signal degradation which, in turn, may lead to errors in data transmission. Because of their design, conventional LGA connectors introduce excessive impedance mismatches and crosstalk that degrade signal quality and therefore limit the performance of the module signal channels and are less desirable for use both within the module and for connection to the motherboard.

It is therefore an object of the invention to provide a high I/O, high density, high reliability module for high performance semiconductors.

It is an additional object of the invention to provide a high I/O, high density module utilizing a novel high density connector technology and is transparent to a number of connector technologies.

It is another object of the invention to provide a high I/O, density impedance control led module that may be field demountable and upgradable.

It is a still further object of the invention to provide a high I/O, high density module that is a cost effective replacement of the current multi-chip modules used in high speed electronic systems.

SUMMARY OF THE INVENTION

The present invention is a cost effective module that provides high performance, high I/O, high density and highly reliability interconnections needed between the various circuit devices that form a functional system or a part of a larger system. It includes a plurality of circuit members, some having contact pads and circuit devices on their surfaces, also including impedance-controlled transmission line signal paths to support high speed operation. Short land grid array connectors or interchangeable alternative connectors provide interconnections between the circuit members and the rest of the system. Driver line terminators may be included on the circuit members for maintaining high electrical performance. The circuit members may be formed on conventional printed circuit cards including integrated and shielded spacers, with unpacked or packed semiconductor chips and other components attached directly to the circuit members. Clamping means is also included. Thermal control structures may be included to maintain the circuit devices within a reliable range of operating temperatures. Suitable applications include but are not limited to mainframe computers, workstations, telecommunications networks, or other electronic equipment.

BRIEF DESCRIPTION OF THE DRAWINGS

A complete understanding of the present invention may be obtained by reference to the accompanying drawings, when taken in conjunction with the detailed description thereof and in which:

FIG. 1 is a cross sectional, enlarged view of a ceramic module including pin-and-socket connectors of the prior art;

FIG. 3b is an exploded perspective view of the module shown in FIG. 3a;

FIG. 5a is a cross section, enlarged side view of a circuit member shown in FIG. 2a, while

FIG. 6a is a cross section, enlarged side view of a circuit member shown in FIG. 2a, while

DETAILED DESCRIPTION OF THE PREFERRED EMBODIMENT

Figure 2A:
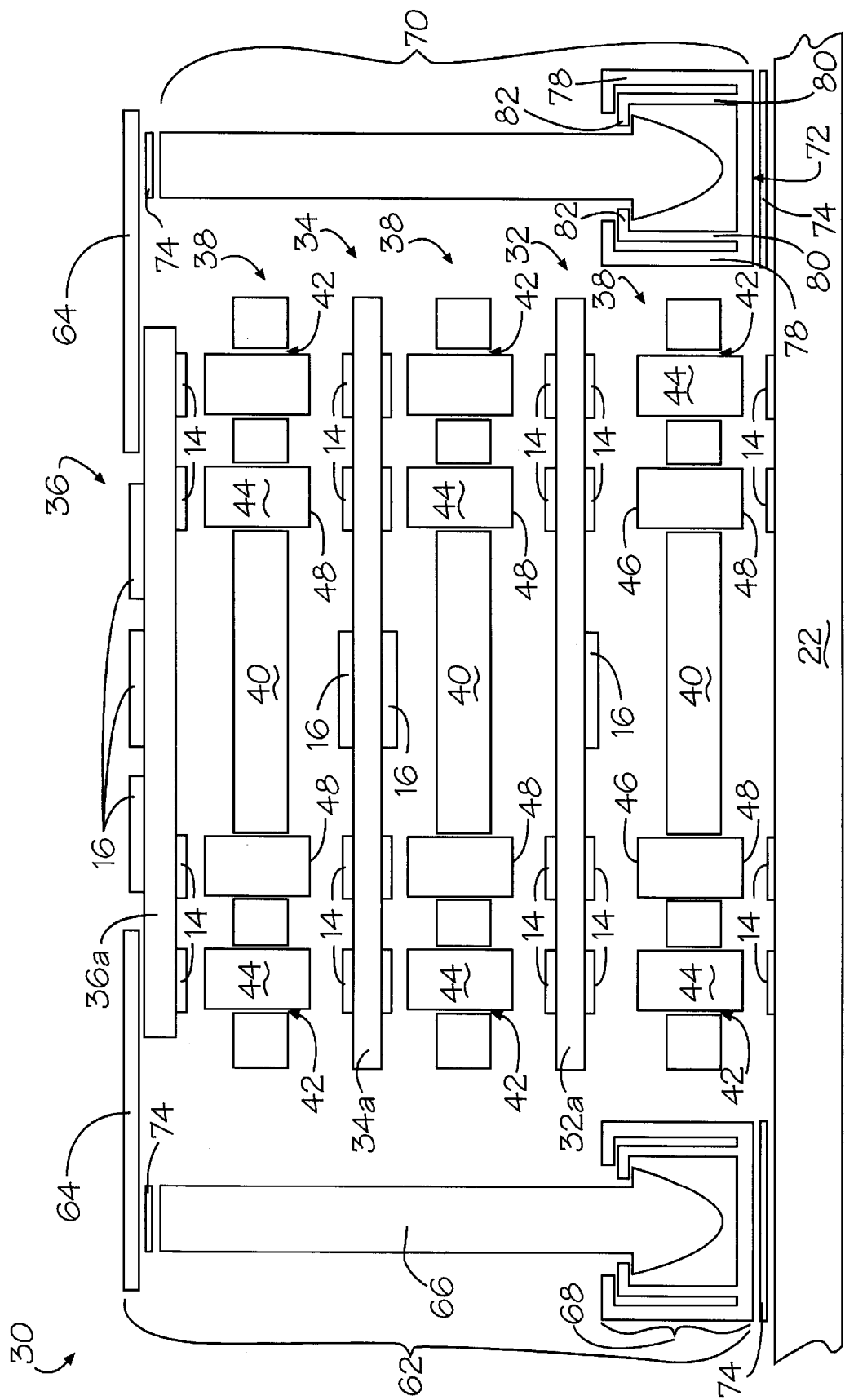
FIG. 2a is a side view, in section and on an enlarged scale, of a field separable module in accordance with one embodiment of the present invention.

Generally speaking, the present invention is a cost effective module that provides high performance, high density and highly reliability interconnections needed between the various circuit devices that form a functional system or a part of a larger system. It includes a plurality of circuit members having high speed, impedance-controlled transmission line signal paths, short land grid array interconnections between circuit members and, optionally, driver line terminators built into one of the circuit members, for maintaining high electrical performance. The circuit members may be formed on conventional printed circuit cards with unpacked or packed circuit devices attached directly to the circuit members. Thermal control structures may be included to maintain the circuit devices within a reliable range of operating temperatures. Clamping means is also included.

Referring first to FIG. 1, there is shown a module 10 of the prior art for electrically interconnecting a plurality of semiconductor elements 16 on substrate 12 to system board 22 by means of pins 18 and sockets 20 disposed between them. In this example substrate 12 comprises a ceramic dielectric material and includes a plurality of layers of circuitry (not shown) to provide all of the interconnections between semiconductor elements 16 and pads 14 of substrate 12. Pins 18 may be attached to pads 14 by a process such as soldering, brazing, or welding. Sockets 20 may be either plated-through-hole or surface mount attach for their connection to system board 22, with the plated-through-hole style being electrically inferior but more commonly used. In either case, the pins 18 and sockets 20 together result in a significant electrical discontinuity, especially at today's high bus speeds. This impedance discontinuity is manifested in terms of increased electrical noise and time delay due to reflections. For ease of manufacture, pins 18 may be contained in a housing 24.

As stated hereinabove, for today's high performance, cost competitive applications, prior art modules 10 have at least one of the following deficiencies: high substrate costs, high interconnection costs, interconnection quantity limitations, interconnection density limitations, and interconnection electrical performance limitations.

Referring now to FIG. 2a, there is shown a module 30 of the present invention for electrically interconnecting a plurality of semiconductor elements 16 on electrical circuit members 32, 34, 36 by means of connectors 38 disposed between them. Compared to the prior art, where a single ceramic substrate provided all of the wiring, the present invention uses a plurality of circuit members 32, 34, 36, and connectors 38 to provide the necessary interconnections between semiconductor elements 16 and system board 22. Although a stack of three parallel circuit members 32, 34, 36 is shown for purposes of disclosure, it should be readily apparent that the concepts taught in this embodiment apply to other quantities of circuit members as well.

Examples of circuit members suitable for interconnection by connectors 38 include printed circuit boards, circuit modules, etc. The term "printed circuit board" is meant to include but not be limited to a multilayered circuit structure including one or more conductive (i.e., signal, power and/or ground) layers therein. Such printed circuit boards, also known as printed wiring boards, are well known in the art and further description is not believed necessary. The term "circuit module" is meant to include a substrate or like member having various electrical components (e.g., semiconductor chips, conductive circuitry, etc.), which may form part thereof. Such modules are also well known in the art and further description is not believed necessary.

The primary reason that the inventive distributed module 30 can replace a module 10 of the prior art is because of the high electrical integrity of the interconnections both within and to module 30. When contact members 44 of connectors 38 are packaged in a shielded carrier member 40 as taught in one of the referenced copending U.S. patent applications, the electrical discontinuity they cause is minimal. This electrical integrity opens up many degrees of freedom for myriad design parameters. The plurality of circuit members 32, 34, 36 allows the partitioning of the semiconductor elements 16 and other components (not shown) to optimize the module in many ways including minimizing path lengths, minimizing the quantity of interconnections, distributing heat build-up, improving wirability, minimizing costs, maximizing component density, and maximizing overall system performance.

Circuit members 32, 34, 36 comprise respective substrates 32a, 34a, 36a and may have a plurality of semiconductor elements 16 thereon. Semiconductor elements 16 may be packaged or unpackaged devices with many attachment options including but not limited to surface mount, ball grid array, and wire bond. It should be understood that other electronic components, such as but not limited to resistors and capacitors, would typically be included with and interconnected to semiconductor elements 16. They are not shown here only for purposes of clarity. By placing additional components that may function as termination components, such as resistors, blocking capacitors and/or decoupling capacitors on the circuit members 32, 34, 36 instead of on system board 22 as taught in U.S. Pat. No. 6,172,895, many benefits may be realized, including interconnection reduction, space saving, and system performance improvement.

The substrates 32a, 34a, 36a of corresponding circuit members 32, 34, 36 may comprise a wide variety of dielectric materials. In one example they are made of epoxy-glass-based materials typically used in printed circuit board fabrication (e.g., FR4) and also include one or more conductive (i.e., signal, power and/or ground) layers therein. Due to stringent electrical specifications, the signal traces typically match the system impedance within a certain tolerance (e.g., ten percent). These materials are preferred because their coefficient of thermal expansion (CTE) substantially matches the CTE of the surrounding structures (including the connectors 38) and because of their relatively low cost. Another possible material is polyimide. It should be understood by those skilled in the art that the various components of the invention may consist of alternate materials, instead of the particular ones described in the disclosed embodiments, without departing from the spirit of the invention.

For this embodiment the clamping mechanism 62 is field separable. This is appropriate for applications that require the ability to upgrade or replace a circuit member 32, 34, 36 or connectors 38 in the field. If the application need not be field separable, the clamping mechanism can be simplified and made readily reworkable only at the factory. This is appropriate for applications where the lowest possible manufacturing cost is desired.

Connector 38 includes a common, electrically insulative carrier member 40 having a plurality of internal apertures or openings 42. The openings 42 are typically cylindrical in shape.

Resilient contact members 44 are located so as to substantially occupy a respective opening 42 in carrier member 40. Contact members 44 are preferably of a construction and composition as taught in copending U.S. patent application, Ser. No. 09/457,776. In one example each contact member 44 has a diameter of about 0.026 inch and a corresponding length of about 0.040 inch. Openings 42 have a diameter of 0.028 inch, just 0.002 inch larger than the outside diameter of contact members 44. The center-to-center distance is 0.050 inch, but could be reduced to about 0.035 inch or less, if required. For any given application, an individual contact member may be used to provide a signal, power, or ground interconnection. In one example each contact member 44 has a maximum resistance of 0.020 ohm. This allows contact members 44 to pass high currents with only a small voltage drop.

Each opposing end 46 and 48 of each contact member 44 is designed for electrically contacting respective flat conductive pads (e.g., copper terminals) 14 on circuit members 32, 34, 36 and system board 22. Understandably, the conductive pads 14 are electrically coupled to corresponding circuitry, which forms part of the respective electrical circuit members 32, 34, 36. These conductive pads 14 may provide signal, power or ground connections, depending on the operational requirements of the respective circuit members 32, 34, 36.

Figure 2B:
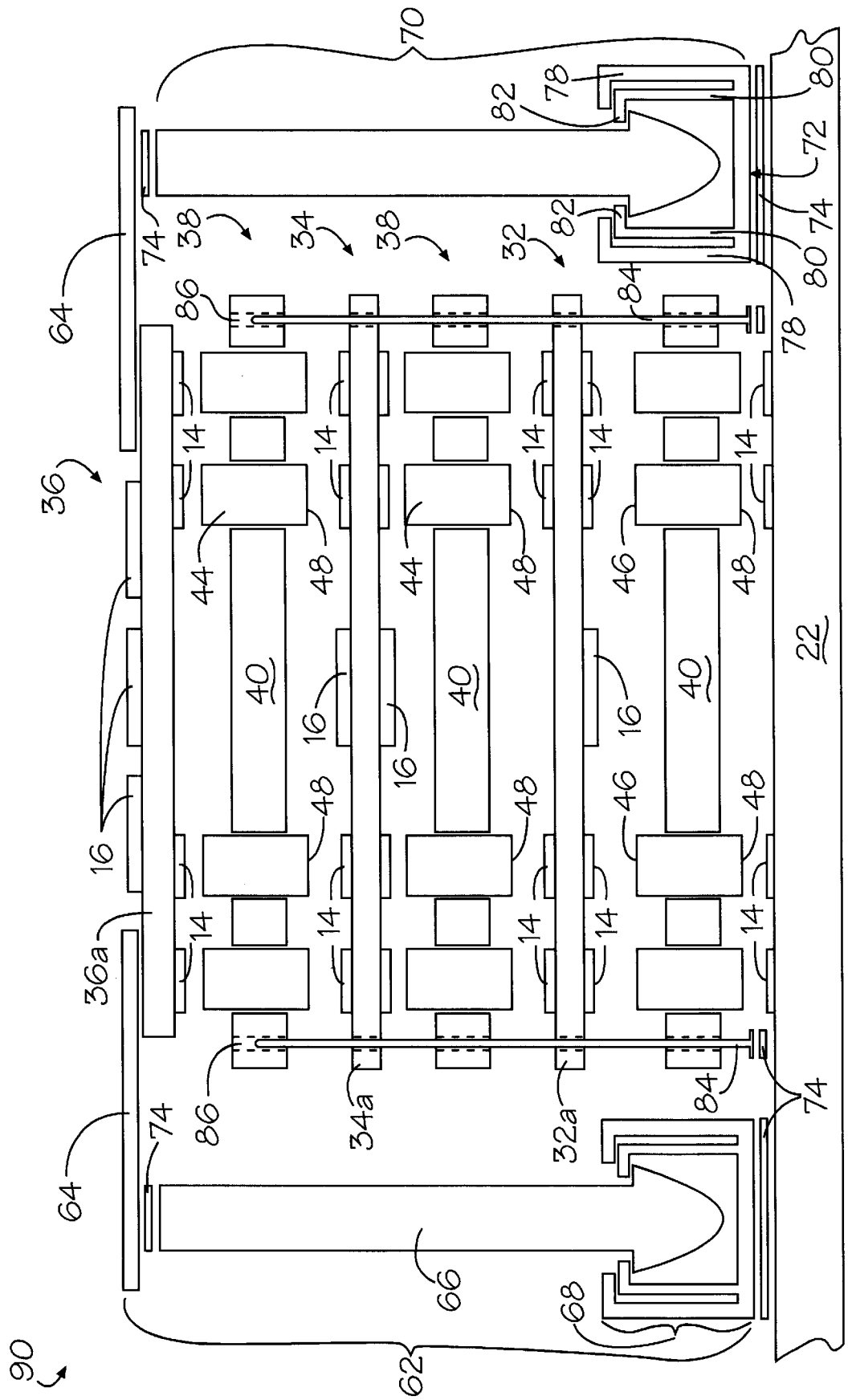
FIG. 2b is a cross section, enlarged side view of the module shown in FIG. 2a further including alignment means.

Carrier member 40, which may also include alignment openings 86 (FIG. 2b), is designed for positioning between circuit members 32, 34, 36 and system board 22, and is aligned therewith. While carrier member 40 is shown in one of its simpler embodiments, for improved clarity of other elements and features of the invention, the teachings of three of the referenced copending U.S. patent applications are considered important aspects of the instant invention that significantly improve performance of carrier member 40. One teaches the mechanical and reliability improvement of carrier member 40 through the inclusion of features such as retentive members in openings 42, and layers of spacers located above and below the planer surfaces of carrier member 40. Two others teach that carrier member 40 can be improved electrically such as by metallizing openings 42, including conductive layers, including additional components, and further including pairs of shorter length contact members, thereby creating a shielded carrier member 40 with additional functionality that can also save real estate on circuit members 32, 34, 36 and system board 22. The recommendations of materials and processes of the aforementioned patent applications are also important to the improved manufacturability and lower cost of the instant invention.

Clamping means 62 creates the force necessary to ensure each contact member 44 of connectors 38 is compressed during engagement to form the appropriate interconnection between corresponding pairs of conductive pads 14, since a retentive force is not inherent as in a pin-and-socket type interconnection. It is preferable that the clamping means 62 does not require any mounting holes in system board 22, provides a controlled and uniform displacement of force over the array of contact members 44, and avoids problems associated with CTE mismatches.

Clamping means 62 consists of upper plate 64, spacers 66, and retentive members 68. Again, upper plate 64 is intended to contact and apply force to the top surface of circuit member 36. Depending on requirements, it may contact only a small portion of the perimeter of circuit member 36 or it may contact a much larger portion thereof. In this embodiment, upper plate 64 is preferably made of a material such as steel, a copper alloy, or a plastic material and is 0.100 inch thick. Steel is preferred for its strength.

Spacers 66 are preferably metal but may also be made of other materials such as plastic. They should be elastically robust in order to maintain the required contact force on all of the contact members 44 over the life of the clamping mechanism 62 following assembly.

Each retentive member 68 consists of a case 78 and inner spring members 80, which further include stops 82. Case 78, spring members 80, and stops 82 may be manufactured as a unitary piece through a process such as extrusion from a material such as metal or plastic. As an alternate, spring members 80 and stops 82 may be formed as a C-shaped spring from a material such as spring steel and then incorporated within a mold or extrusion where the case 78 may be formed from an optimal material.

Case 78 provides several functions beyond being a housing for retentive member 68. It provides a relatively flat surface 72 that is used to attach it to system board 22. It also provides rough alignment for the insertion of spacer 66 into retention member 68 and it limits the outward excursion of spring members 80.

Once spacers 66 are inserted into retentive members 68, they work together as integral units to provide the clamping forces on upper plate 64. In this embodiment, the spacer/retentive member pairs 70 are longer strips located just left and right, and extending to the back edge of circuit member 36 and carrier member 40.

The vertical position of the interface between spacers 66 and stops 82 relative to the height of contact members 44 controls the displacement of, or force on the contact members 44 of connectors 38. Spring members 80 and stops 82 are designed to allow movement to relieve thermal expansion displacement mismatches during operation. The attachment means 74 can be made as thin as possible in order to be elastically strong but avoid high thermal stresses, which are damaging to thin layers of material.

It should be obvious to those skilled in the art of the myriad possible design and manufacturing alternatives available, such as but not limited to the quantity, specific shape, dimensions, processes, and materials of the various elements of module 30, including the number and packaging of semiconductor elements and other components, which may vary depending on specific requirements. These types of variations are well with the scope of the present invention.

In this embodiment spacers 66 are attached to upper plate 64 and retentive members 68 are attached to system board 22 by attachment means 74, which is intended to be reworkable at the factory. Many methods may be used to accomplish this reworking procedure including chemical (e.g., dissolvable adhesives) and metallurgical (e.g., thin solder layers).

To take full advantage of the benefits, such as avoiding CTE mismatches and having a light weight and a small form, as this clamping mechanism 62 provides, it is preferable that connectors 38 have high compliance to accommodate the non-planarity of mating circuit members 32, 34, 36 and system board 22, especially at lower clamping forces.

To enable interconnection, circuit member 36 (with spacers 66 attached) is intended to be inserted vertically into retentive member 68 and retained by stops 82 of spring members 80. Removal of circuit members 36 with spacers 66 attached may be accomplished in several ways. The simplest method is to slide circuit member 36 sideways the full length of retentive member 68. Other methods are described in one of the referenced copending U.S. patent applications.

Although a means for aligning circuit members 32, 34, 36 and carrier members 40 to system board 22 has not been shown specifically in this embodiment, it should be readily apparent to those skilled in the art that many methods may be implemented. Examples are disclosed in two of the referenced copending U.S. patent applications. An additional method is disclosed in FIG. 2b. There is shown a module 90 further including alignment means to align carrier members 40 and circuit members 32, 34, 36 to system board 22. In this embodiment the alignment means consists of a plurality of pins 84, solder, chemical, or other attachment means known in the art 74, and alignment openings 86.

Figure 2C:
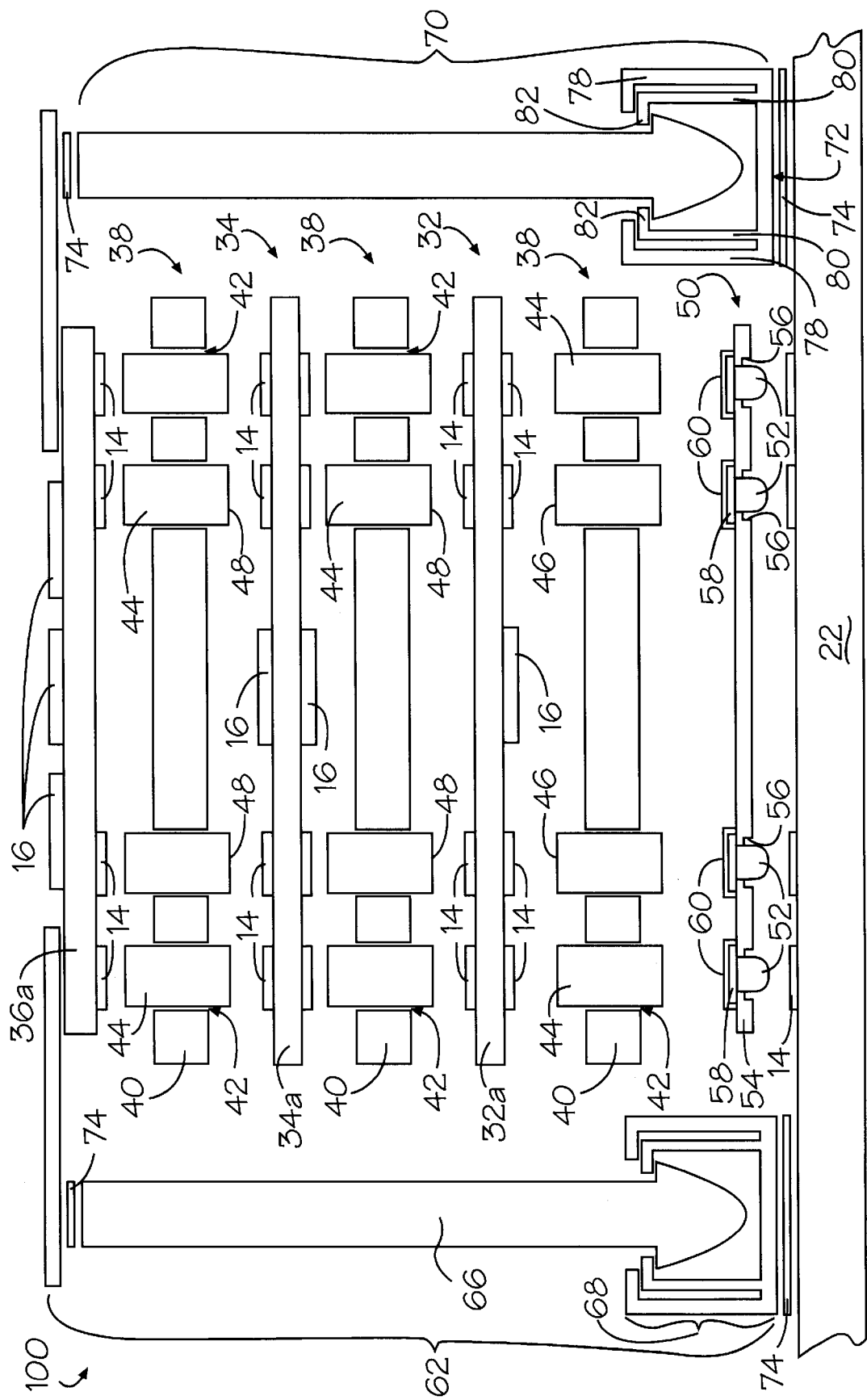
FIG. 2c is a cross section, enlarged side view of the module shown in FIG. 2a further including an interposer.

Referring now to FIG. 2c, there is shown a side view of a module 100 similar to module 30 of FIG. 2a, but further including an interposer 50 for providing a reworkable plurality of contact pads 58 for system board 22. When used in conjunction with connectors 38, a path for electrically interconnecting electrical circuit members 32, 34 and 36 to system board 22 is provided.

Interposer 50, as taught in one of the referenced copending U.S. patent applications, acts as a carrier to avoid expensive processes such as special platings on conductive pads 14 on the system board 22. Contact pads 58 are provided that are large enough for adequate connector alignment tolerances and the proper functioning of high density connectors 38.

Interposer 50 includes a dielectric layer 54 having a plurality of internal stepped apertures or openings 56, each one corresponding to and aligned with a contact pad 58. In one example, dielectric layer 54 is composed of Kapton (a trademark of E. I. DuPont deNemours & Co., Wilmington, Del.) or Upilex (a trademark of Ube Industries, Ltd., Japan) and is 0.020-inch thick. Other examples of suitable materials for dielectric layer 54 are liquid crystal polymer (LCP) and epoxy-glass-based materials (i.e., FR4). These materials have a CTE that substantially matches the CTE of the surrounding structures. Dielectric layer 54 may also comprise more than one layer of material to allow the implementation of alternate methods of manufacture.

Conductive members 52 are intended to be located in corresponding stepped openings 56 and are in electrical contact with corresponding contact pads 58. In one example, the diameter of conductive member 52 is 0.026 inch and the height is 0.030 inch prior to reflow. Contact pads 58 are copper, covered by a plating layer 60, which in this example is a 200 micro-inch thick layer of nickel covered by a 50 micro-inch thick layer of gold. In this example, the center-to-center distance of contact pads 58 is 0.050 inch, but could be reduced to about 0.035 inch or less, if required.

Figure 3A:
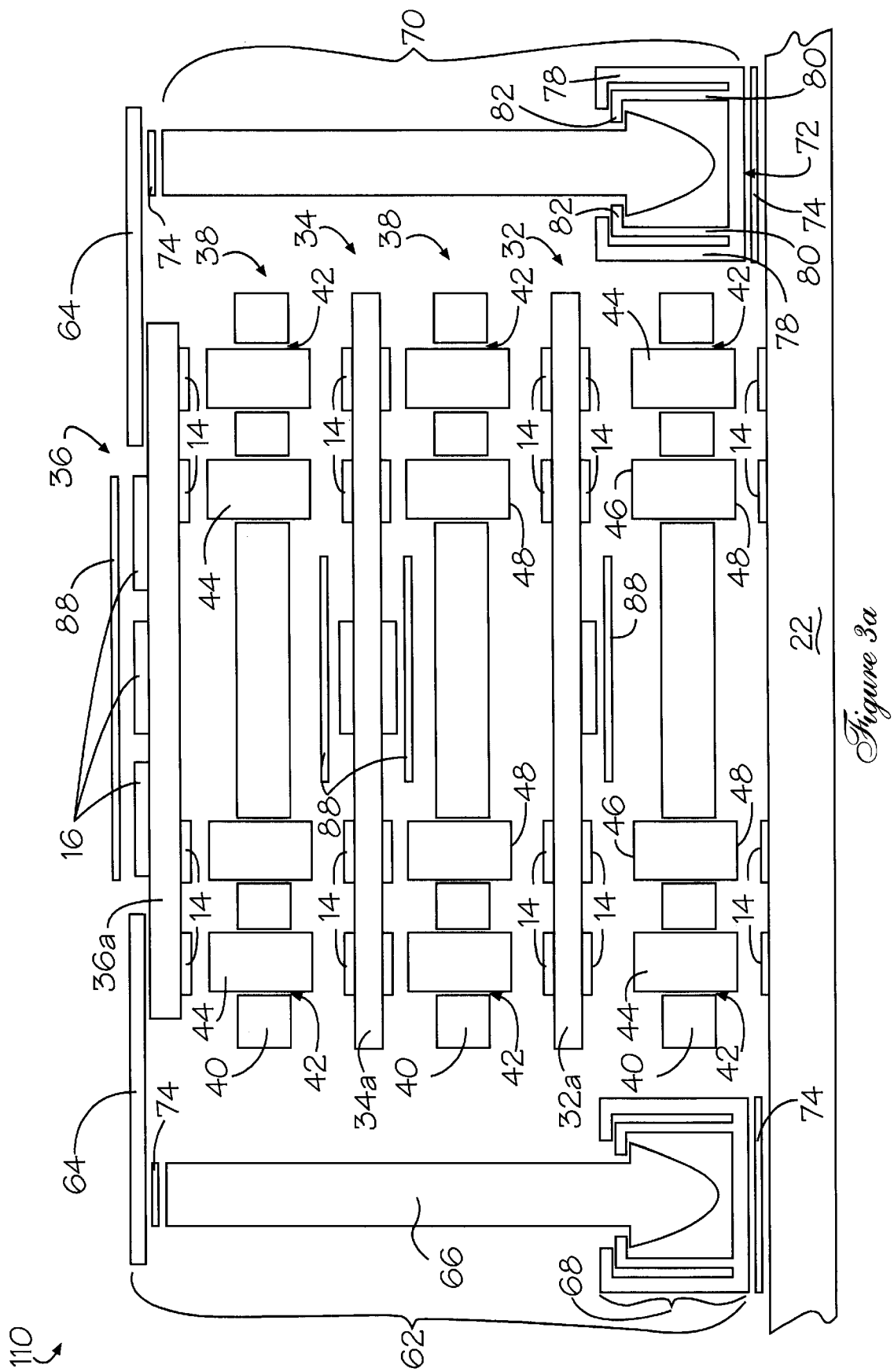
FIG. 3a is a cross section, enlarged side view of a field separable module in accordance with an extension of the first embodiment of the present invention.
Figure 3B:
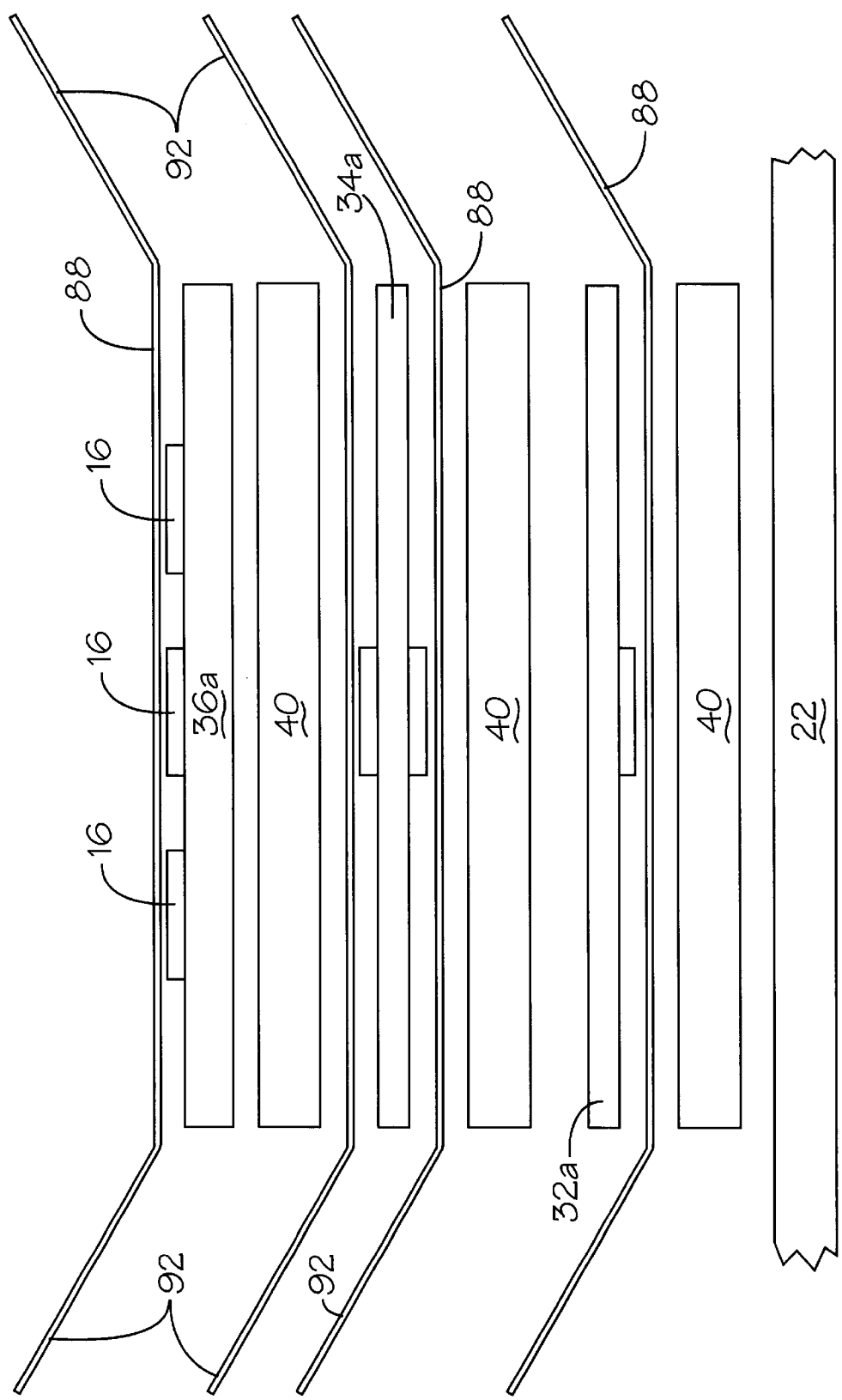

Referring now to FIGS. 3a and 3b, there are shown a cross section, enlarged side view and a cross section, enlarged end view, respectively, of a field separable module 110 in accordance with an extension of the first embodiment of the present invention, further including thermal management structures 88.

The natural cooling efficiency of an module 110 is low due to the lack of an effective thermal transfer medium from the die or package of semiconductor elements 16 to the air, and the lack of a short air channel in the direction of air flow (i.e., parallel to system board 22). It is exacerbated by the relatively large size of today's semiconductor elements 16 and the proximity to other heat generating elements 16 in such a dense module 110. The thermal management structures 88 of the inventive module are designed to optimize both thermal conduction and radiation, thus allowing maximum circuit density without heat build-up, which could degrade semiconductor element 16 performance and reliability.

Thermal management structures 88 are intended to sink heat away from semiconductor elements 16. Such structures 88 may be stand alone elements (e.g., heatsinks) or they may provide a low resistance thermal path to another surface such as the outer enclosure of a device (e.g., a laptop computer), which may include thermally conductive material.

Thermal management structures 88 may be implemented in many ways. They may be as simple as a layer of thermally conductive material, such as aluminum, attached or retained to semiconductor elements 16 by thermally enhanced compounds or clamps. Structures 88 may be more complex (FIG. 3b) and include elements such as fins 92 to augment cooling. Other methods may include the use of conformal pouches of liquid thermal transfer material, thin heat pipes, and thermoelectric devices. Even other methods of solving thermal issues will be obvious to those skilled in the art.

Compared to the prior art module 10 (FIG. 1), where all contacts pads must be located on a fixed grid on the bottom surface, the module 30 of the present invention allows contact pads to be optimally located in many ways to enhance parameters such as contact density, wirability, reliability, and electrical and mechanical performance. This feature can also optimize system board 22.

Figure 4:
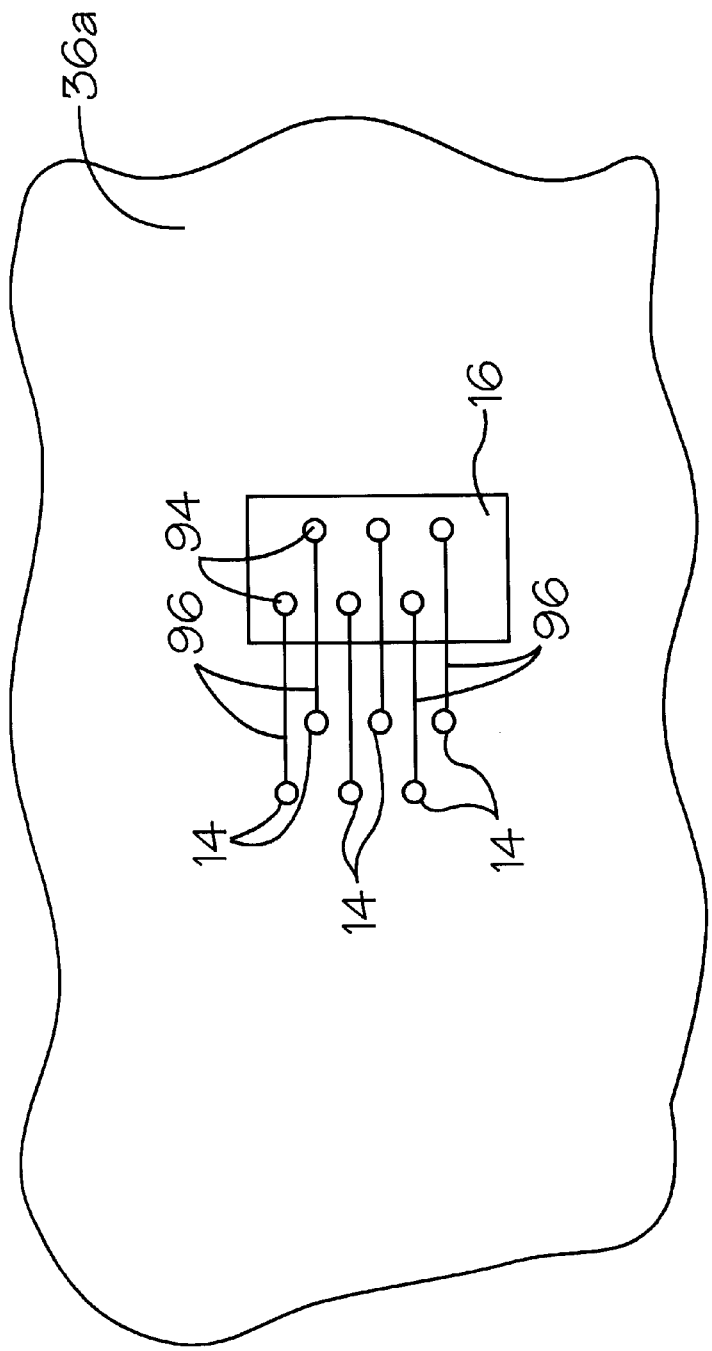
FIG. 4 shows a technique for enhancing electrical performance that is inherent in the disclosed embodiments of the invention.

One example of how the instant invention provides a method to optimize the electrical characteristics of the signal connections on circuit members 32, 34, 36. Referring now to FIG. 4, by judicious placement of the conductive pads 14 on the substrate 36a of circuit member 36 relative to the device pads 94 of semiconductor element 16, it is possible to both minimize and equalize the length, and therefore optimize the electrical performance of all signal connections 96 between them. This concept can be applied to other circuit members 32 and 34 as well.

Figure 5A:
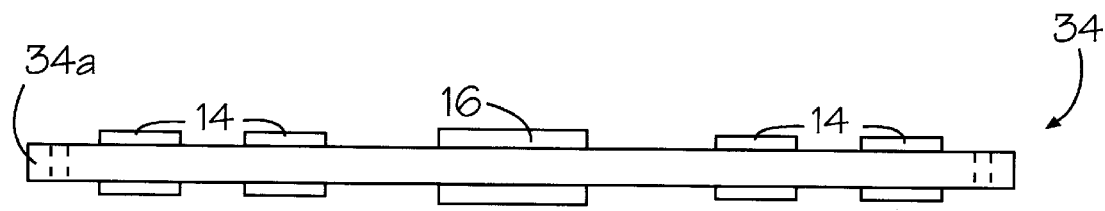
Figure 5B:
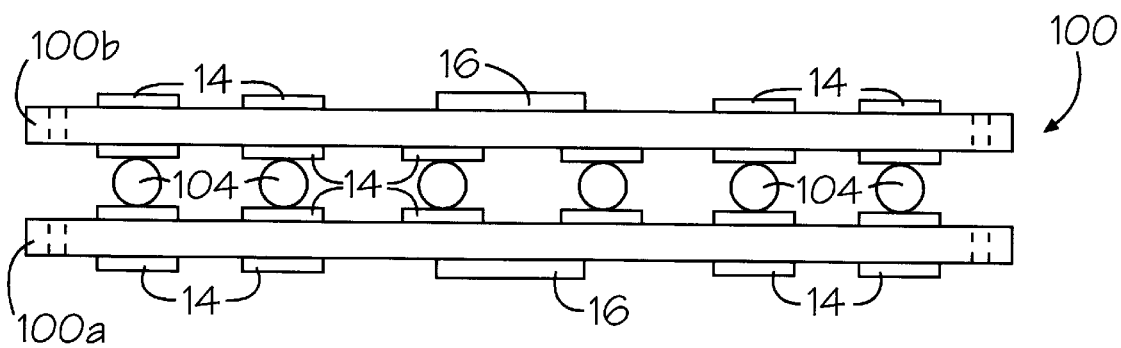
FIGS. 5b and 5c show alternative circuit members with multiple substrates and BGA interconnection therebetween.
Figure 5C:
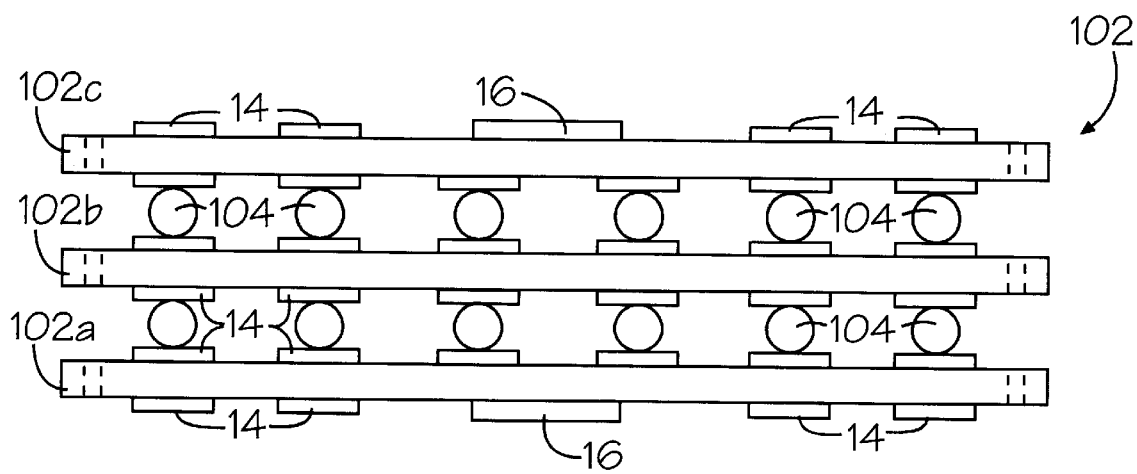

Referring now to FIG. 5a, there is a cross section, enlarged side view of a circuit member shown in FIG. 2a, and FIGS. 5b and 5c, which show alternative circuit members with multiple substrates and BGA interconnection therebetween. As previously shown, circuit member 34 comprises a substrate 34a and may have a plurality of semiconductor elements 16 as well as other components (not shown) thereon. Semiconductor elements 16 may be packaged or unpackaged devices with many attachment options including but not limited to surface mount, ball grid array, and wire bond.

In the same manner that module 30 (FIG. 2a) used a plurality of less complex and therefore less expensive circuit members 32, 34, 36 to provide the interconnection among a plurality of semiconductor elements 16, this distributed concept can be taken one step further. A circuit member 34 may comprise multiple substrates as shown in circuit members 100 and 102.

Circuit member 100 comprises two substrates 100a and 100b and again may have a plurality of semiconductor elements 16 as well as other components (not shown) thereon. In this example, conductive pads 14 of substrates 100a and 100b are interconnected through an array of BGA solder interconnections 104.

Circuit member 102 comprises three substrates 102a–102c and again may have a plurality of semiconductor elements 16 as well as other components (not shown) thereon. In this example, conductive pads 14 of substrates 102a–102c are interconnected through an array of BGA solder interconnections 104.

This further distribution of circuitry can be beneficial in many ways. For some applications, it may be more cost effective than using a single, more complex circuit member 34. If complete field separability is not a requirement, since a solder connection is an inherently more reliable and lower cost interconnection than any connector, the reliability of the overall module is improved. Also multiple-substrate circuit members 100, 102 can be very useful in allowing functional partitioning within the overall module to maximize various parameters, including performance and cost. Due to their smaller size, BGA solder interconnections 104 can help reduce the overall module thickness in height-sensitive applications. Preferred materials for substrates 100a–100b and 102a–102c are the same as for the circuit members in the abovementioned embodiments.

Figure 6A:
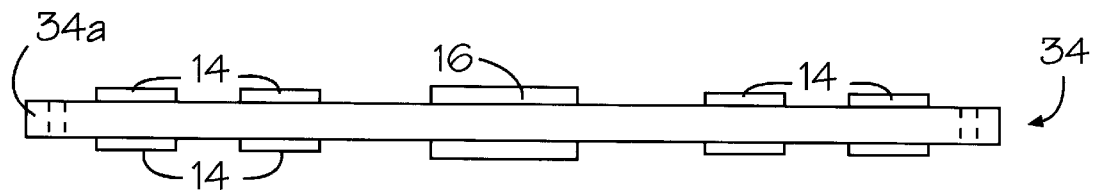
Figure 6B:
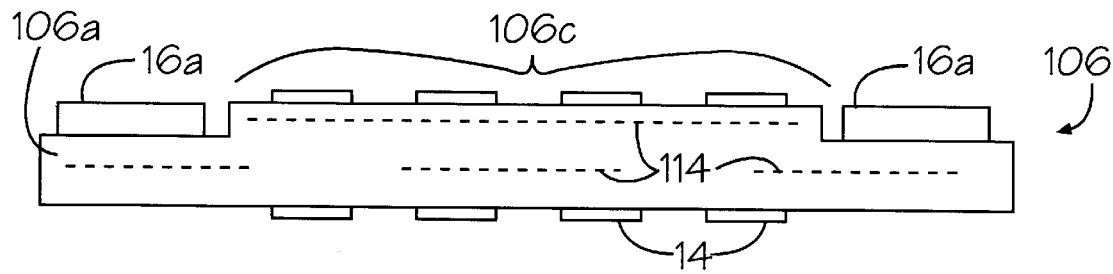
FIGS. 6b–6e show alternative circuit members with stepped substrates for accommodating a wider range of applications.
Figure 6C:
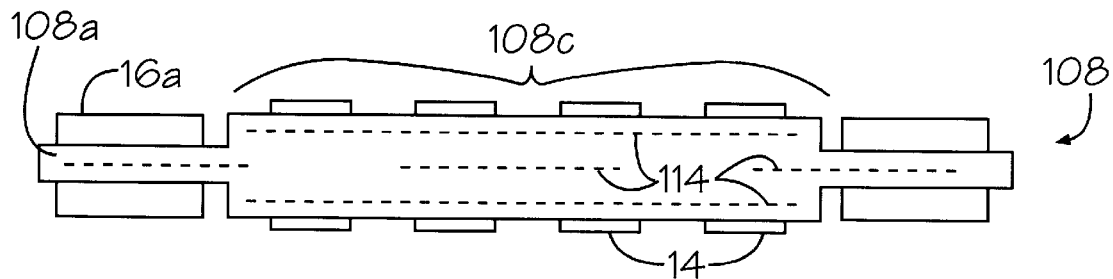
Figure 6D:
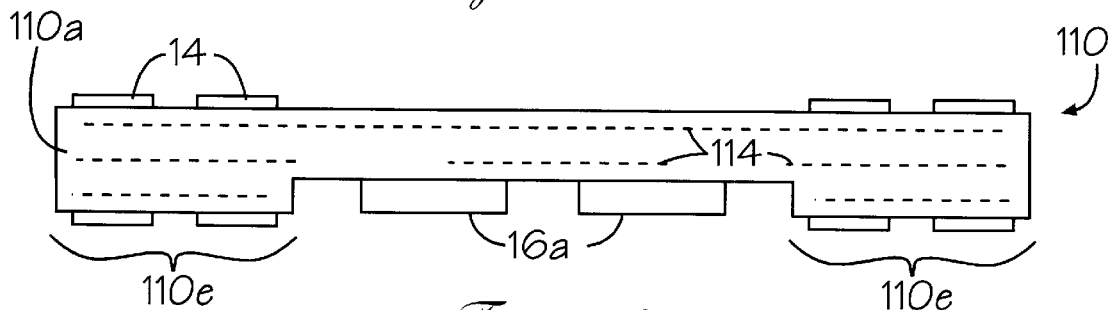
Figure 6E:
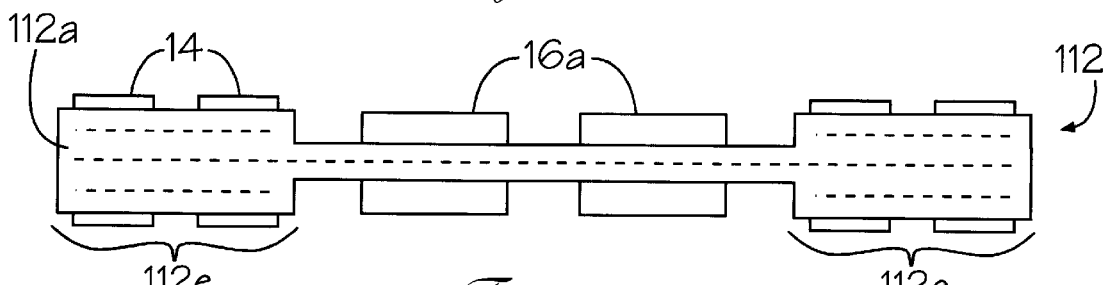

Referring now to FIG. 6a, there is a cross section, enlarged side view of a circuit member shown in FIG. 2a, and FIGS. 6b–6e, which show alternative circuit members 106, 108, 110, 112 with stepped substrates 106a, 108a, 110a, 112a, respectively, which may have a plurality of semiconductor elements 16 as well as other components (not shown) thereon, for accommodating a wider range of applications. Semiconductor elements 16 may be packaged or unpackaged devices with many attachment options including but not limited to surface mount, ball grid array, and wire bond.

Substrate 106a of circuit member 106 (FIG. 6b) includes a raised center area 106c on its upper surface to allow more room for larger devices 16a and other elements such as cooling structures (not shown), without interfering with the interconnections from the upper surface.

Substrate 108a of circuit member 108 (FIG. 6c) includes a raised center area 108c on both its upper and its lower surfaces to allow more room for larger devices 16a and other elements such as cooling structures (not shown) on both sides, without interfering with the interconnections of either surface.

Circuit members 106 and 108 may further include thermally and electrically conductive planes 114 to improve the performance of various aspects of the overall modules including providing shielding for the longer vias (not shown) in the center areas 106c and 108c, respectively.

Substrate 110a of circuit member 110 (FIG. 6d) includes a raised outer area 110e on its lower surface to allow more room for larger devices 16a and other elements such as cooling structures (not shown), without interfering with the interconnections from the lower surface.

Substrate 112a of circuit member 112 (FIG. 6e) includes raised outer areas 112e on both its upper and its lower surfaces to allow more room for larger devices 16a and other elements such as cooling structures (not shown) on both sides, without interfering with the interconnections of either surface. If devices 16a are not populated on the bottom surface of substrate 112a, for example, raised outer area 112e allows circuit member 112 to be stacked on top of circuit members such as circuit member 34, whose top-surface-located device 16 could otherwise interfere with soldered interconnections 104 as shown in FIG. 5b or 5c.

Circuit members 110 and 112 may further include thermally and electrically conductive planes 114 to improve the performance of various aspects of the overall modules including providing shielding for the longer vias (not shown) in the outer areas 110e and 112e, respectively.

When the concepts shown in FIGS. 5b and 5c and FIGS. 6b–6e are incorporate d into the previously disclosed embodiments, it should be readily apparent that many additional module configurations and solutions are possible. It should also be apparent that parameters such as the quantity, specific shape, dimensions, and materials of the cards and the number, layout and packaging of components may vary depending on certain requirements.

Figure 7:
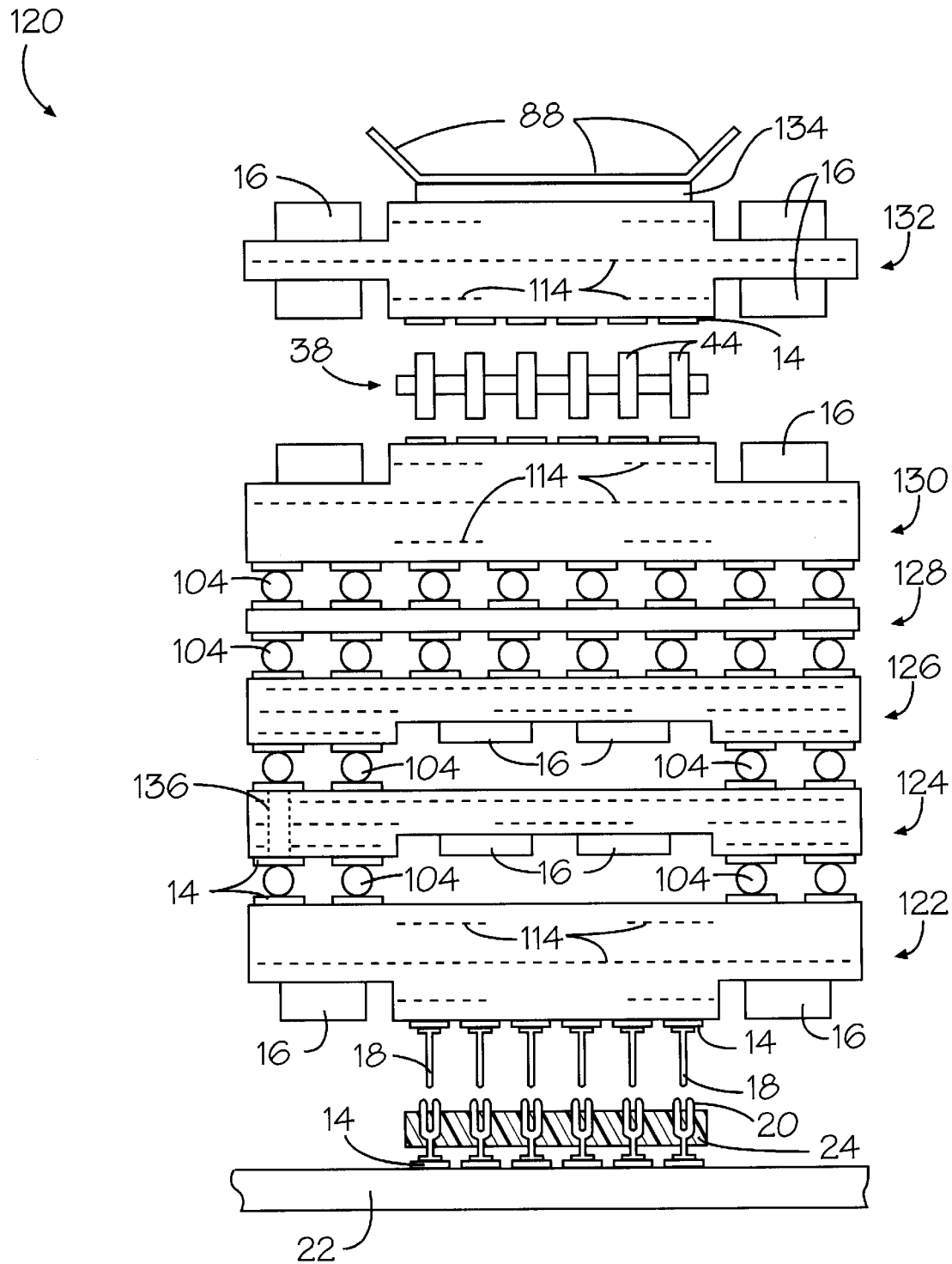
FIG. 7 is a cross section, enlarged side view of another implementation of the invention including some of the concepts taught in FIGS. 5a–5c and 6a–6e.

Referring now to FIG. 7, there is shown a module 120 of the present invention for electrically interconnecting a plurality of semiconductor elements 16 and 134 as well as other components (not shown) on electrical circuit members 122, 124, 126, 128, 130 and 132 by means of connector 38 and BGA solder interconnections 104 disposed between them to demonstrate some of the hereinabove disclosed possible technology options available.

As in the prior art case (FIG. 1), module 120 is electrically interconnected to system board 22 by means of pins 18 and sockets 20 disposed between them. While the inclusion of pins 18 is not preferable for the integrity of high speed electrical signals, it may be required for those applications where the new module will be used to replace or upgrade an existing module (i.e., where the interconnection to a system board 22 is already defined). For ease of manufacture, pins 18 may be contained in a housing 24.

The circuit members of module 120 may further include thermally and electrically conductive planes 114 to improve the performance of various aspects of the overall module including providing shielding for the longer vias 136 as shown in circuit member 124.

In this example semiconductor element 134 is a larger device than semiconductor elements 16. Element 134 may be a higher power device such as a microprocessor or a controller. Module 120 may also comprise thermal management structure 88 to dissipate heat from element 134 and therefore improve the overall reliability of the module 120.

Since other modifications and changes varied to fit particular operating requirements and environments will be apparent to those skilled in the art, this invention is not considered limited to the example chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. A stackable electronic module for high frequency semiconductor devices, comprising:

a) a first circuit member having a first surface and a second surface, having a plurality of contact pads disposed on said first surface, at least one of said contact pads for external electrical connection, and having a plurality of contact pads disposed on said second surface;

b) a second circuit member having a first surface and a second surface, and having a plurality of contact pads disposed on said first surface, at least one of said contact pads for electrical connection to at least one contact pad on said second surface of said first circuit member;

c) first electrical connection means, including a contact member to provide electrical interconnection, operatively connected to at least one of said contact pads on said second surface of said first circuit member and at least one of said contact pads on said first surface of said second circuit member;

d) clamping means attached to at least one of said first and second circuit members to compress said contact member of said first electrical connection means; and wherein at least one of said first and second circuit members comprises a raised center area on at least one of said first and second surfaces thereof.

2. The stackable electronic module for high frequency semiconductor devices as recited in claim 1, further comprising at least one semiconductor device directly located on at least one of said surfaces of said first or second circuit members and selectively connected to at least one of said contact pads.

3. The stackable electronic module for high frequency semiconductor devices as recited in claim 1, further comprising second electrical connection means, including a contact member to provide electrical interconnection, operatively connected to at least one of said contact pads on said first surface of said first circuit member forming an extension of an external electrical connection.

4. The stackable electronic module for high frequency semiconductor devices as recited in claim 1, further comprising alignment means operatively connected to said first and second circuit members for aligning said first electrical connection means thereto.

5. The stackable electronic module for high frequency semiconductor devices as recited in claim 3, further comprising alignment means operatively connected to said first circuit member for aligning said second electrical connection means thereto.

6. The stackable electronic module for high frequency semiconductor devices as recited in claim 1, further comprising a data bus.

7. The stackable electronic module for high frequency semiconductor devices as recited in claim 6, further comprising bus termination means operatively connected to said data bus.

8. The stackable electronic module for high frequency semiconductor devices as recited in claim 7, wherein said data bus comprises a characteristic impedance and said bus termination means exhibits an impedance substantially matching said characteristic impedance.

9. The stackable electronic module for high frequency semiconductor devices as recited in claim 7, wherein said bus termination means comprises at least one electrical component from the group: resistors, capacitors and inductors.

10. The stackable electronic module for high frequency semiconductor devices as recited in claim 9, wherein said resistors comprise discrete resistors.

11. The stackable electronic module for high frequency semiconductor devices as recited in claim 9, wherein said resistors comprise a resistor pack.

12. The stackable electronic module for high frequency semiconductor devices as recited in claim 9, wherein said resistors comprise a solid-state resistive device.

13. The stackable electronic module for high frequency semiconductor devices as recited in claim 7, wherein said bus termination means is located on said first or second circuit member.

14. The stackable electronic module for high frequency semiconductor devices as recited in claim 1, wherein said first electrical connection means is a land grid array connector.

15. The stackable electronic module for high frequency semiconductor devices as recited in claim 1, wherein said first circuit member comprise wiring means connecting at least one of said contact pads on said first surface to at least one of said contact pads on said second surface.

16. The stackable electronic module for high frequency semiconductor devices as recited in claim 1, wherein at least one of said first and second circuit members comprise a multi-layer printed circuit card.

17. The stackable electronic module for high frequency semiconductor devices as recited in claim 2, wherein at least one of said semiconductor devices comprises at least one from the group of: bare chip, thin, small-outline packages (TSOP), chip scale packages (CSP) and chip on board (COB).

18. The stackable electronic module for high frequency semiconductor devices as recited in claim 1, wherein said first and second circuit members are substantially parallel to one another.

19. The stackable electronic module for high frequency semiconductor devices as recited in claim 18, further comprising an external printed circuit structure and wherein said first and second circuit members are substantially parallel to said external printed circuit structure.

20. The stackable electronic module for high frequency semiconductor devices as recited in claim 2, further comprising thermal management structures.

21. The stackable electronic module for high frequency semiconductor devices as recited in claim 20, wherein said thermal management structures comprise heat-conductive fins in thermal contact with said at least one semiconductor device.

22. The stackable electronic module for high frequency semiconductor devices as recited in claim 1, wherein at least one of said first and second circuit members comprises a plurality of substrates.

23. The stackable electronic module for high frequency semiconductor devices as recited in claim 22, wherein said plurality of substrates is interconnected by factory-reworkable means.

24. The stackable electronic module for high frequency semiconductor devices as recited in claim 23, wherein said factory-reworkable means comprises solder balls.

25. The stackable electronic module for high frequency semiconductor devices as recited in claim 1, wherein said raised center area comprises a via.

26. The stackable electronic module for high frequency semiconductor devices as recited in claim 25, further comprising a plurality of shielding layers for shielding said via.

27. The stackable electronic module for high frequency semiconductor devices as recited in claim 3, wherein at least one of said first and second electrical connection means comprises factory-reworkable connections.

28. The stackable electronic module for high frequency semiconductor devices as recited in claim 27, wherein said factory-reworkable connections comprise solder balls.

29. The stackable electronic module for high frequency semiconductor devices as recited in claim 3, wherein said second electrical connection means comprises pin-grid-array connections.

30. The stackable electronic module for high frequency semiconductor devices as recited in claim 1, wherein said first and second circuit members comprise at least one insulative material.

31. The stackable electronic module for high frequency semiconductor devices as recited in claim 30, wherein said at least one insulative material of said first circuit member has a coefficient of thermal expansion (CTE) that substantially matches the CTE of said at least one insulative material of said second circuit member.

32. The stackable electronic module for high frequency semiconductor devices as recited in claim 30, wherein said at least one insulative material has a coefficient of thermal expansion (CTE) that substantially matches the CTE of the material of the structure(s) to which it is to be interconnected.

33. The stackable electronic module for high frequency semiconductor devices as recited in claim 30, wherein said at least one insulative material is epoxy-glass-based.

34. The stackable electronic module for high frequency semiconductor devices as recited in claim 30, wherein said at least one insulative material comprises FR4.

35. The stackable electronic module for high frequency semiconductor devices as recited in claim 30, wherein said at least one insulative material comprises polyimide.

36. A stackable electronic module for high frequency semiconductor devices, comprising:
   a) a first circuit member having a first surface and a second surface, having a plurality of contact pads disposed on said first surface, at least one of said contact pads for external electrical connection, and having a plurality of contact pads disposed on said second surface;
   b) a second circuit member having a first surface and a second surface, and having a plurality of contact pads disposed on said first surface, at least one of said contact pads for electrical connection to at least one contact pad on said second surface of said first circuit member;
   c) electrical connection means, including a contact member to provide electrical interconnection, operatively connected to at least one of said contact pads on said second surface of said first circuit member and at least one of said contact pads on said first surface of said second circuit member;
   d) clamping means attached to at least one of said first and second circuit members to compress said contact member of said electrical connection means;
wherein at least one of said first and second circuit members comprises a raised outer area on at least one of said first and second surfaces thereof.

37. The stackable electronic module for high frequency semiconductor devices as recited in claim 36, wherein said raised outer area comprises a via.

38. The stackable electronic module for high frequency semiconductor devices as recited in claim 37, further comprising a plurality of shielding layers for shielding said via.

* * * * *